(12) United States Patent
Roberts et al.

(10) Patent No.: US 6,392,395 B2
(45) Date of Patent: May 21, 2002

(54) AUTOMATIC CIRCUIT BREAKER DETECTOR

(75) Inventors: Allan Roberts, Lockport; Thomas Mavec, Joliet, both of IL (US)

(73) Assignee: Robotics Technologies, Inc., Joliet, IL (US)

(*) Notice: Subject to any disclaimer, the term of this patent is extended or adjusted under 35 U.S.C. 154(b) by 0 days.

(21) Appl. No.: 09/727,457

(22) Filed: Dec. 4, 2000

Related U.S. Application Data

(63) Continuation-in-part of application No. 09/420,502, filed on Oct. 19, 1999, now abandoned.

(51) Int. Cl.[7] .......................... G01R 19/00; G01R 31/28
(52) U.S. Cl. .......................... 324/66; 324/67; 324/529
(58) Field of Search ........................ 324/529, 527, 324/528, 66, 67

(56) References Cited

U.S. PATENT DOCUMENTS

| | | | |
|---|---|---|---|
| 3,924,179 A | 12/1975 | Dozier | |
| 4,121,152 A | 10/1978 | Hale et al. | |
| 4,129,825 A | 12/1978 | Brinegar | |
| 4,475,078 A | * 10/1984 | Itani | 324/529 |
| 4,734,638 A | 3/1988 | Weber | |
| 4,801,868 A | 1/1989 | Brooks | |
| 4,906,938 A | 3/1990 | Konopka | |
| 5,422,564 A | * 6/1995 | Earle et al. | 324/67 |
| 5,497,094 A | * 3/1996 | George | 324/529 |
| 5,828,219 A | * 10/1998 | Hanlon et al. | 324/529 |
| 6,163,144 A | * 12/2000 | Steber et al. | 324/67 |

FOREIGN PATENT DOCUMENTS

| | | |
|---|---|---|
| EP | 0 752 482 | 1/1997 |
| FR | 2 566 539 | 6/1984 |
| GB | 1162811 | 8/1969 |

OTHER PUBLICATIONS

Schematic Diagram.
86–044005/07 Sing—Power Cables.

* cited by examiner

Primary Examiner—N. Le
Assistant Examiner—Anjan K. Deb
(74) Attorney, Agent, or Firm—Schiff Hardin & Waite

(57) ABSTRACT

In a method and system for detecting a particular AC circuit from among a plurality of AC circuits at a circuit box, a transmitter is plugged into the particular AC circuit to be detected, the transmitter creating a high amplitude high-frequency current pulse. With a receiver, sensing the particular circuit at the circuit box by use of a sensing coil and employing a variable gain stage in conjunction with a threshold comparator and latch to pick off a signal caused by the high amplitude high frequency current pulse. The signal is latched so that a microprocessor can read the signal to activate an indication to a user when the particular AC circuit has been located at the circuit box. The microprocessor can be programmed after it is mounted into the receiver by use of a computer which transfers a program to the microprocessor. In an alternate embodiment of the invention, instead of the latch, the threshold comparator connects to an interrupt input of the microprocessor.

20 Claims, 6 Drawing Sheets

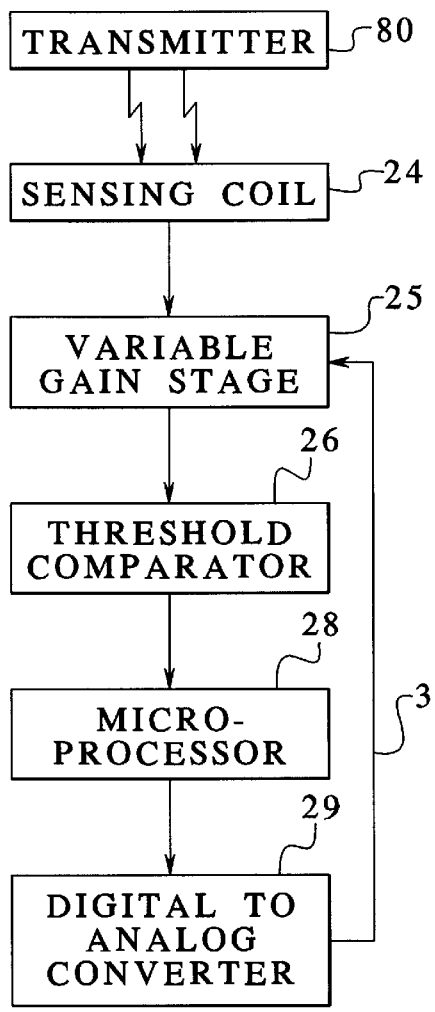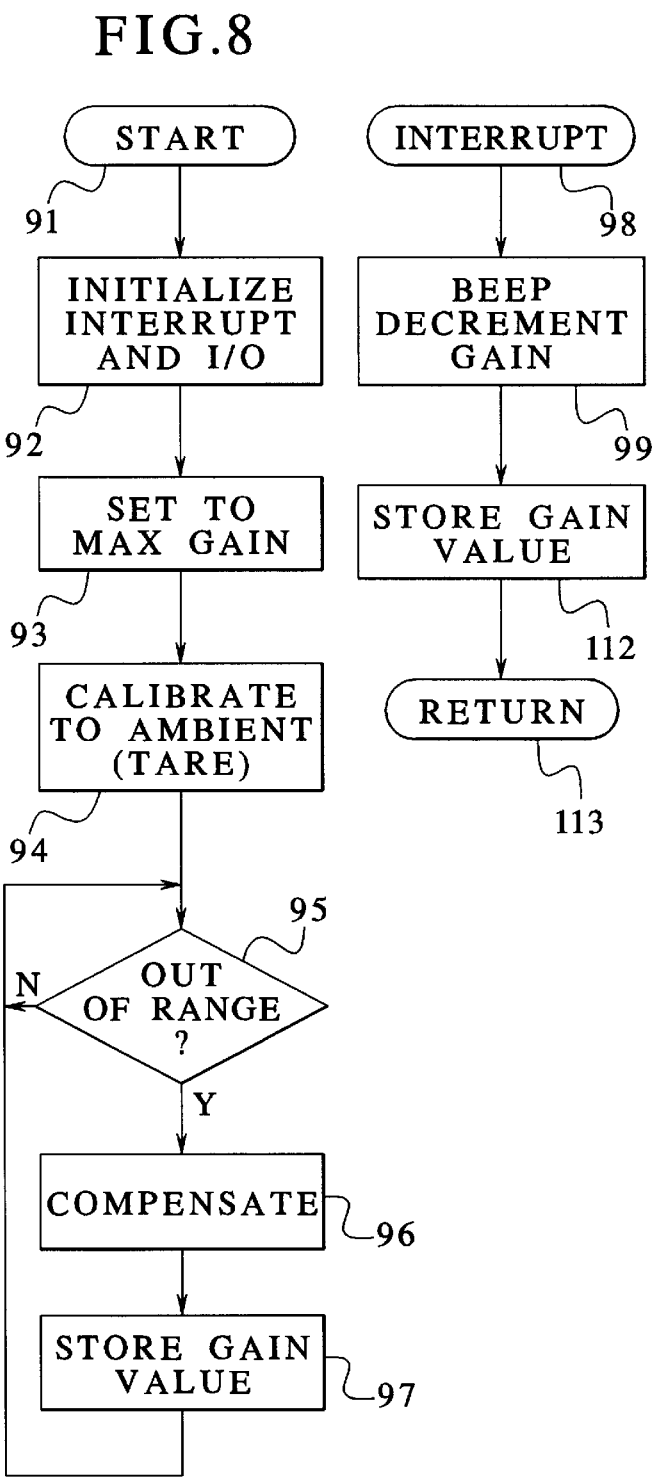

AUTOMATIC CIRCUIT BREAKER DETECTOR

RELATED APPLICATION

This is a Continuation-In-Part of earlier application Ser. No. 09/420,502, filed Oct. 19, 1999 entitled "Improved Automatic Circuit Breaker Detector" by the same inventors as the instant application, now abandoned.

BACKGROUND OF THE INVENTION

The present invention relates to automatic circuit breaker detectors.

It is known in prior art automatic circuit breaker detectors to provide a relaxation oscillator transmitter which creates high frequency high amplitude current pulses with a transmitter which plugs into a conventional AC outlet such as in a house wired for 110 AC. The high current amplitude high frequency pulses are transmitted via the 110 AC wiring to a circuit breaker box, located in a designated area within a home or business. Typically the circuit breaker box has a plurality of circuit breaker switches arranged in a column or a row.

Prior art automatic circuit breaker detector receivers are known which emit an audible indication when the receiver unit is brought adjacent to the particular circuit breaker or a line associated with the particular circuit breaker corresponding to the circuit in which the transmitter is plugged at the remote outlet. When the receiver unit begins to emit an audible sound, then the user has identified, without the need for switching off the circuit breaker switch, the particular circuit in which the transmitter has been remotely plugged. This has the known advantage that circuits can be identified without the need of actually switching off the circuit breaker detector. Thus, for example, electronic equipment does not have to be reset after a resumption of power.

It is a significant disadvantage of such prior art automatic circuit breaker detectors that they can provide false indications at the receiver when attempting to locate the circuit breaker corresponding to the remotely plugged in transmitter unit. For example, the receiver unit may emit an audible indication when it is placed adjacent more than one of the circuit breakers in the circuit breaker box, thus providing a false indication. Also, the receiver unit might not provide any indication, despite the presence of the current pulses on the particular circuit which is being located.

SUMMARY OF THE INVENTION

It is an object of the present invention to improve the reliability and performance of automatic circuit breaker detectors so as to minimize the presence of false indications, and to maximize sensitivity automatically without manual calibration so that detection of a particular circuit breaker can be reliably detected in most or virtually all instances.

According to the present invention, a method and system are provided for detecting a particular AC circuit from among a plurality of AC circuits at a circuit box. A transmitter is plugged into the particular AC circuit to be detected and which creates a high amplitude high frequency current pulse. With a receiver unit, the particular circuit is sensed at the circuit box by use of a sensing coil. A variable gain stage is employed in conjunction with a threshold comparator and a latch to pick off the signal and latch the signal so that a microprocessor can read the signals and activate an indication to a user when the appropriate circuit has been located. Calibration occurs immediately by decreasing the gain of the variable gain stage automatically until the signal can no longer be detected, and then the gain is increased slightly so that the variable gain stage operates right at a threshold of the threshold comparator.

Also according to the present invention, in the receiver unit a variable gain stage is employed in conjunction with a threshold comparator and a microprocessor and wherein the microprocessor has an interrupt input connected to an output of the threshold comparator so as to pick off the signal so that the microprocessor can read the signals and activate an indication to a user when the appropriate circuit has been located. Calibration occurs immediately by decreasing the gain of the variable stage automatically until the signal can no longer be detected, and then the gain is increased slightly so that the variable gain stage operates right at a threshold of the threshold comparator.

BRIEF DESCRIPTION OF THE DRAWINGS

FIG. 6 is a block diagram of the improved automatic circuit breaker detector system of the invention employing an interrupt input on the microprocessor in a second embodiment of the invention;

FIG. 8 is a block diagram flow chart of a software program employed in the second embodiment of FIGS. 6 and 7.

DESCRIPTION OF THE PREFERRED EMBODIMENTS

Figure 1B:
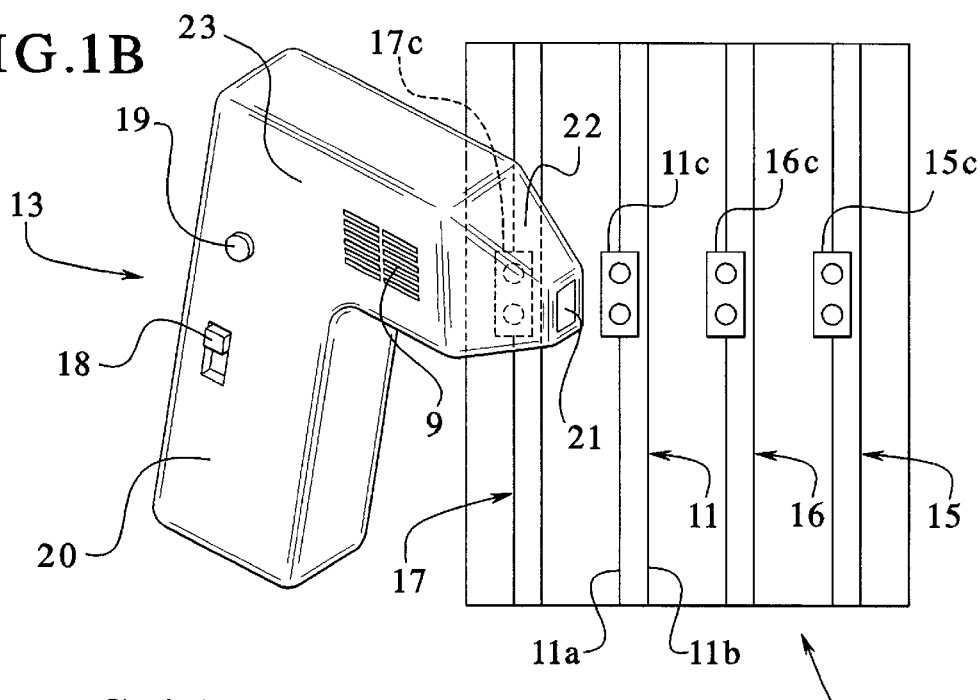
FIG. 1B is a perspective view of an automatic circuit breaker detector receiver of the system according to the invention employed in locating a particular circuit breaker or circuit associated with that breaker in a circuit breaker box.
Figure 1A:
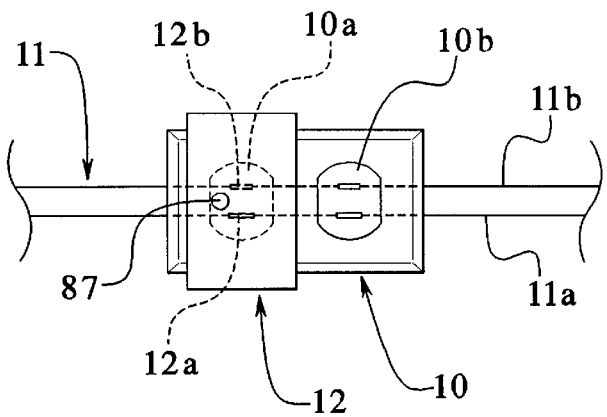
FIG. 1A is a front view of a typical wall socket having the transmitter used in the automatic circuit breaker detector system of the invention plugged into it.

The transmitter used in the improved circuit breaker detector system of the invention as shown in FIG. 1A at 12. It is housed in a box having two prongs 12*a* and 12*b* protruding from one face thereof which are plugged into one of the sockets 10*a* or 10*b* of the wall outlet 10 connected to a particular electrical 110 volt AC circuit 11 formed of two circuit lines 11*a* and 11*b*. The transmitter has an LED 87 which is illuminated when the transmitter is functioning to create high current high frequency current pulses in the AC line 11 as described hereafter.

To locate the particular circuit into which the transmitter is plugged, as shown in FIG. 1B a receiver 13 is provided such as in a pistol grip casing having on its backside a power switch 18 and a light such as an LED 19 for indicating when the receiver is turned on. The receiver has slots 9 through which an audible sound can be emitted as described hereafter.

At the front face of the pistol grip unit, a sensor surface 21 having an associated sensing coil 24 (see FIGS. 2 and 4) is provided. This sensing face 21, located at on the end of a tapered projection 22 at the top portion 23 of the pistol grip having a lower handle portion 20, is positioned adjacent-various circuit breakers 11c, 15c, 16c, and 17c provided in respective AC line circuits 11, 15, 16 and 17 in a circuit breaker box 14. The receiver senses the voltage drop which occurs at the circuit breaker, such as may result due to internal resistance of the circuit breaker, or as a result of the internal inductance of the circuit breaker. Since the current pulses are very high frequency and very high amplitude current, even small circuit breaker resistances or switch inductances can be detected. The receiver unit also will detect the current pulses on the AC line itself, although in the preferred mode the unit is detecting voltage drops at the circuit breakers.

When the receiver is positioned adjacent the circuit breaker such as 11c corresponding to the circuit 11 into which the transmitter is plugged at a remote location, then the receiver unit will emit an audible sound only when the detecting face 21 of the receiver unit is adjacent the proper circuit breaker. When it is moved away from the designated circuit breaker, then no sound is emitted.

Figure 2:
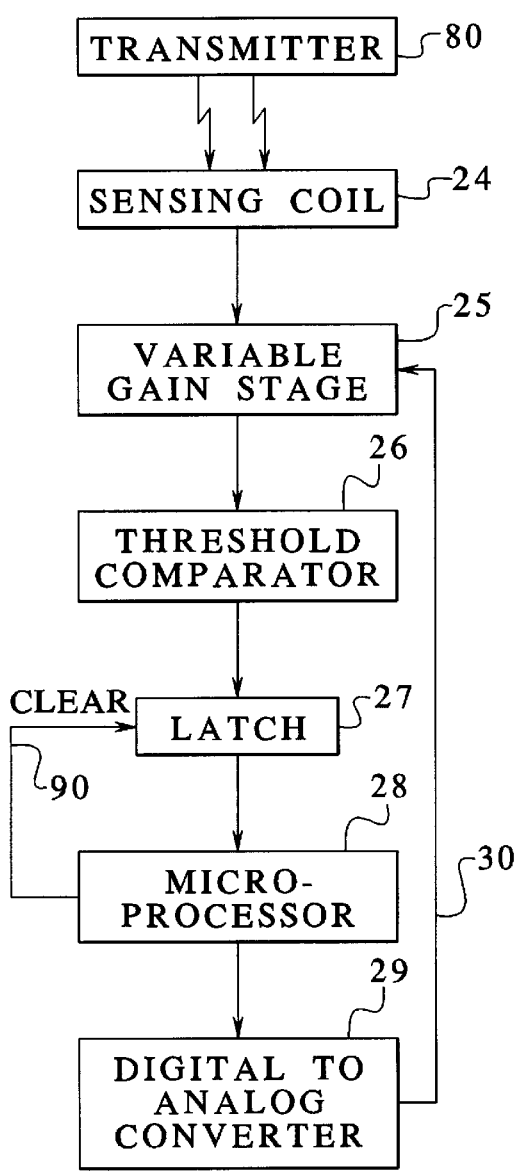
FIG. 2 is a block diagram of the improved automatic circuit breaker detector system of the invention.
Figure 5:
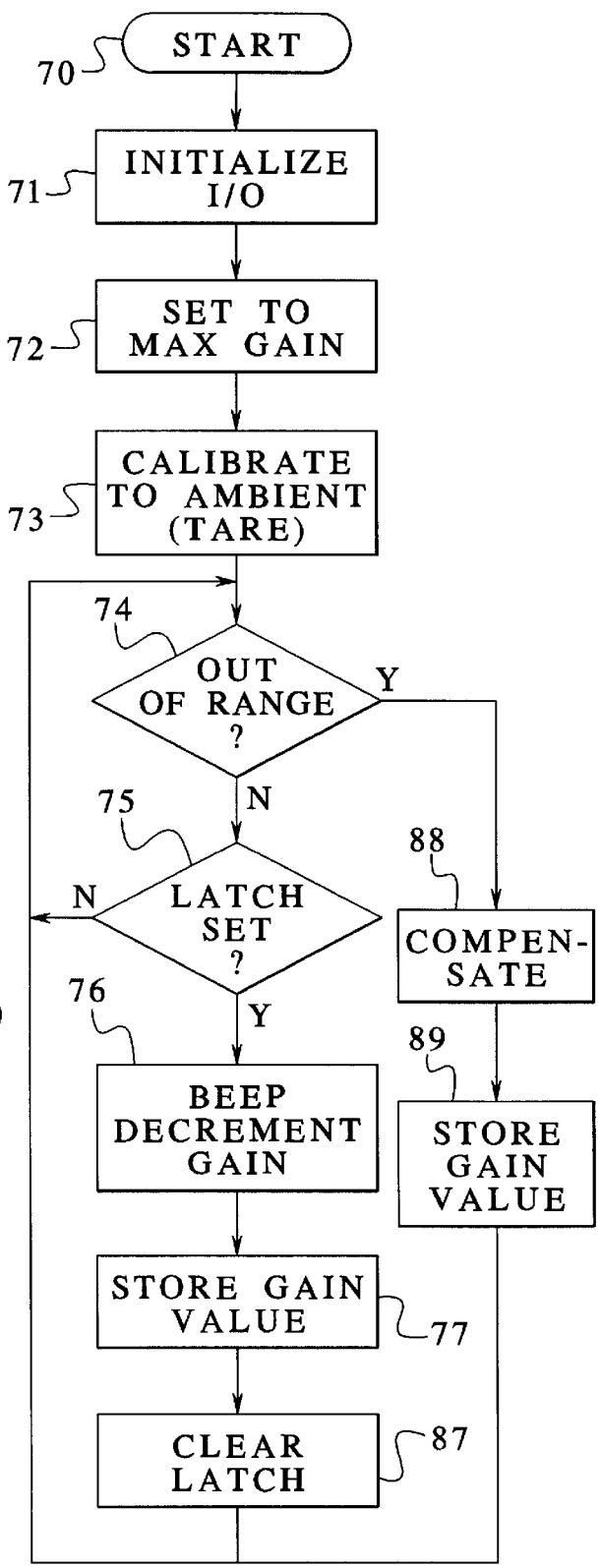
FIG. 5 is a block diagram flow chart of the software program employed in the first embodiment of the present invention.

In the block diagram of FIG. 2, the transmitter 80 is shown transmitting the high frequency high amplitude pulses along the AC line. This signal is picked up by the sensing coil 24 when the sensing coil 24 at the sensing face is positioned adjacent to the appropriate circuit breaker corresponding to the circuit in which the transmitter 80 is plugged. In addition to the sensing coil 24, the receiver has a variable gain stage 25 which amplifies the signal from the sensing coil 24. The amplified signal from the variable gain stage 25 is fed into a threshold comparator 26. If the output of the variable gain stage 25 meets or exceeds the voltage reference of the threshold comparator 26, latch 27 will be set. The microprocessor 28 monitors the status of the latch 27. If the latch 27 is set, the microprocessor 28 will adjust the value of the digital-to-analog converter 29 which, through the feedback line 30, will decrease the sensitivity of the variable gain stage 25. The microprocessor 28 will then clear the latch 27 via line 90 and alert the user. If the microprocessor 28 determines that a signal is out of range it will compensate by increasing the gain of the variable gain stage amplifier 25 by a predetermined value output to the digital to analog converter 29 through feedback line 30.

Figure 3:
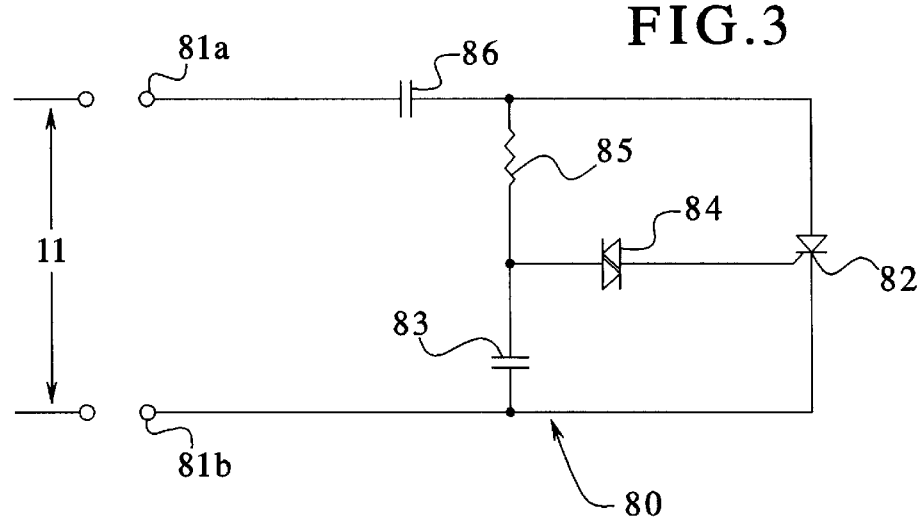
FIG. 3 is a schematic diagram of a transmitter portion used with the improved automatic circuit breaker detector system of the invention.

As shown in FIG. 3, the transmitter 80 connects at terminals 81a and 81b 81A and 81B to the AC line 11. Terminal 81a connects through a capacitor 86 and resistor 85 to a DIAC 84. The DIAC 84 periodically triggers to discharge capacitor via SCR 82 controlled by 84 to create the high frequency high current pulse which is sent over the AC line 11.

Figure 4:
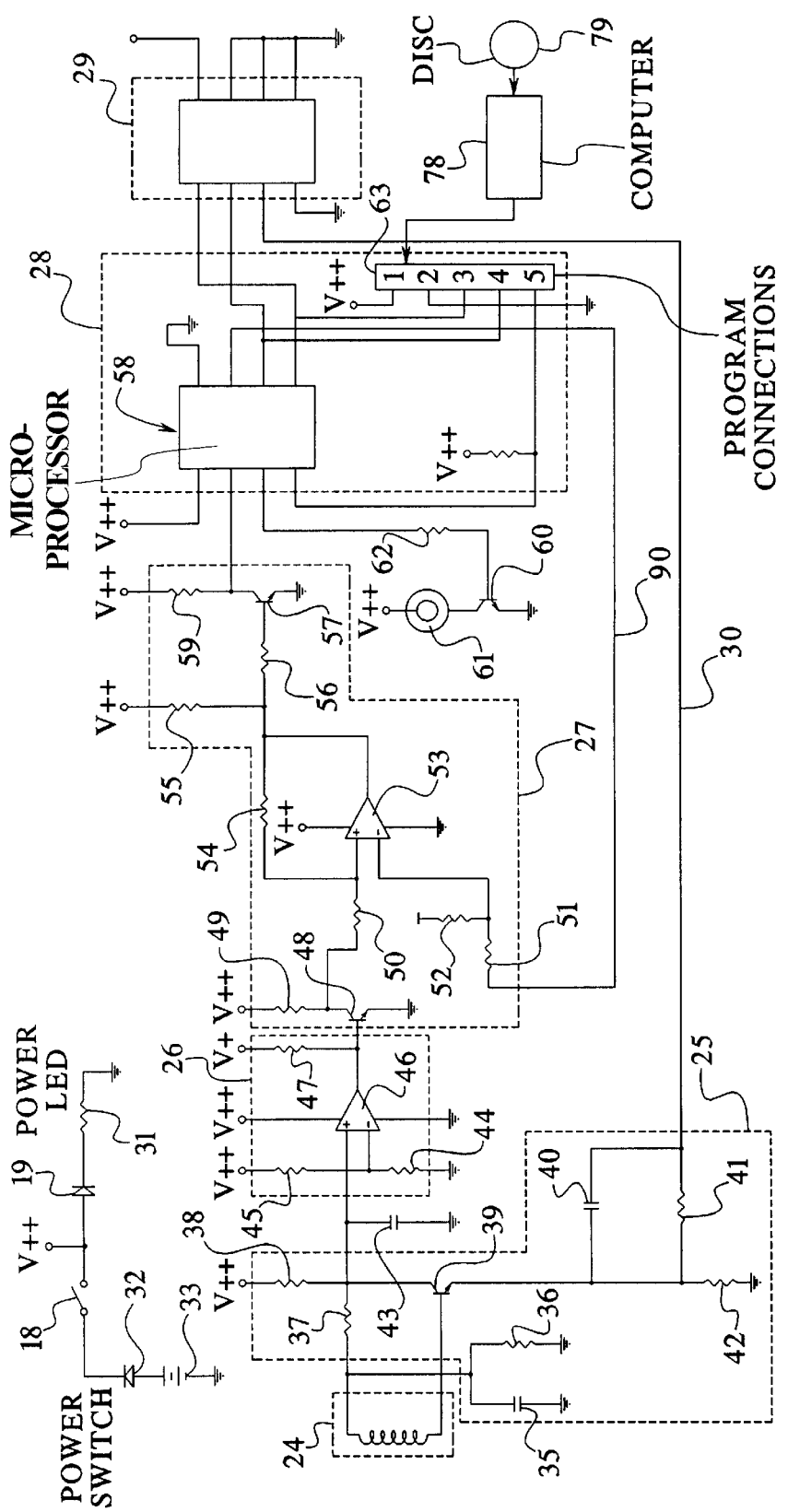
FIG. 4 is a schematic diagram of a first embodiment of the inventive receiver portion of the improved circuit breaker detector system of the invention.

Now referring to FIG. 4, the receiver has a power supply comprising a battery 33, a diode 32, the power switch 18, the power indicating LED 19, and a resistor 31. A V++ terminal indicates the voltage outlet to the remaining circuitry of the receiver At the bottom of FIG. 4 at the lower left a voltage regulator 65 is indicated for converting the V++ voltage to a lower voltage V+ which is filtered at 66. Additional filters 67, 68 and 69 are also provided which connect to various integrated circuits to provide a filtered source of V+ or V++ voltage.

The variable gain stage 25 is formed of the coil 24, capacitor 35, resistor 36, resistor 37, resistor 38, and transistor 39. Also the transistor 39 connects to a capacitor 40, a resistor 41, and a resistor 42 as shown.

The output of the variable gain stage 25 has a high frequency filter capacitor 43 which improves the sensitivity and reliability of the system in detecting a signal on a single circuit breaker among a plurality of circuit breakers. This typically has a relatively small capacitance value such as 47 pf.

The signal from the variable gain stage 25 is connected to the threshold comparator 26 having a voltage reference provided by resistors 44 and 45, and resistor 47 at its output.

The latch 27 is formed of resistors 51, 52, 56, and transistor 48 connected to resistor 49. The latch 27 receives a clear signal on line 90 through resistor 51 from microchip 58. An amplifier stage 53 having an associated feedback resistor 54 is provided fed with power from resistor 55. Resistor 56 connects the amplifier 53 to transistor 57 having an associated resistor 59.

The transistor 57 has its output connected to a microprocessor chip. This microprocessor is externally programmable via a program connection block 63.

The microprocessor chip is connected to provide an output to a piezo element 61 which provides an audible signal such as about 2000 Hz and which is driven by a transistor 60 controlled by voltage coming in through resistor 62 from the microprocessor. This piezo-element provides the audible sound when a detected signal is present.

The output of the microprocessor connects to the digital-to-analog converter 29.

In order to program the microprocessor chip 58 with the program shown in FIG. 2, a computer 78 connects to the program connections 63 and which downloads the program from a disk 79, for example, to the microprocessor chip 58.

A start block 70 indicates power-up and the beginning of program execution. The initialize I/O block 71 sets the microprocessor pins as inputs and outputs. The set to max gain block 72 outputs a value to the D/A converter that sets the variable-gain stage to its maximum sensitivity. The calibrate-to-ambient (tare) block 73 decreases the gain of the variable gain stage until no signal is present, thus preventing false signals from being validated. If an out-of-range condition occurs, then the compensate block 88 increases the value that is output to the D/A converter to increase the gain of the variable gain stage, thereby preventing a loss-of-signal condition. The gain value is stored block 89 and the program loops back to the out-of-range decision block 74. The latch-set decision block 75 will loop back to the out-of-range decision block 74 if the input signal has not set the latch. If the latch is set, then the program proceeds to the beep/decrement gain block 76, which will decrement the output value to the D/A converter, thereby decreasing the sensitivity of the variable gain stage, and then annunciates to the user. The gain value is stored in block 77 and the latch is cleared 87. The program then flows back to the out-of-range decision block 74.

With the present invention, by use of the threshold comparator 26 and latch 27, the microprocessor can pull in a signal more reliably and does not miss pulses. This results in higher receiver accuracy and more reliability with fewer false indications.

Moreover, the microprocessor is programmed after it is soldered into the circuit. This has a distinct advantage over the prior art system where microprocessors would have to be programmed prior to mounting into the circuit. This results in higher production efficiency and ease of handling of the microprocessor. The programming is thus more reliable and easier to accomplish.

There is also the dual benefit that the program connection block also provides terminals at which a function test can be performed to determine whether the receiver unit is properly functioning.

There is the further advantage with the in circuit programmability of the microprocessor that if the program changes, old units in inventory do not have to be destroyed. Rather, engineering changes to the programming whereby new software is placed into the microprocessor can be accomplished with existing inventory units.

Also according to the present invention, with the in-circuit programmability of the microprocessor, inputs and outputs are initialized.

In an alternate embodiment of the invention as shown by the block diagram of FIG. 6, the transmitter 80 is shown transmitting the high frequency high amplitude pulses along the AC line. This signal is picked up by the sensing coil 24 when the sensing coil 24 at the sensing face is positioned adjacent to the appropriate circuit breaker corresponding to the circuit in which the transmitter 80 is plugged. In addition to the sensing coil 24, the receiver has a variable gain stage 25 which amplifies the signal from the sensing coil 24. The amplified signal from the variable gain stage 25 is fed into a threshold comparator 26. If the output of the variable gain stage 25 meets or exceeds the voltage reference of the threshold comparator 26, an interrupt signal will be present at the microprocessor. The microprocessor will act upon the interrupt by adjusting the value of the digital to analog to converter 29, which through the feedback line 30 will decrease the sensitivity of the variable gain stage 25. The microprocessor 28 will then alert the user. If the microprocessor 28 determines that a signal is out of range, it will compensate by increasing the gain of the variable gain stage amplifier 25 by a predetermined value through the digital to analog converter 29 and through feedback line 30.

Figure 7:
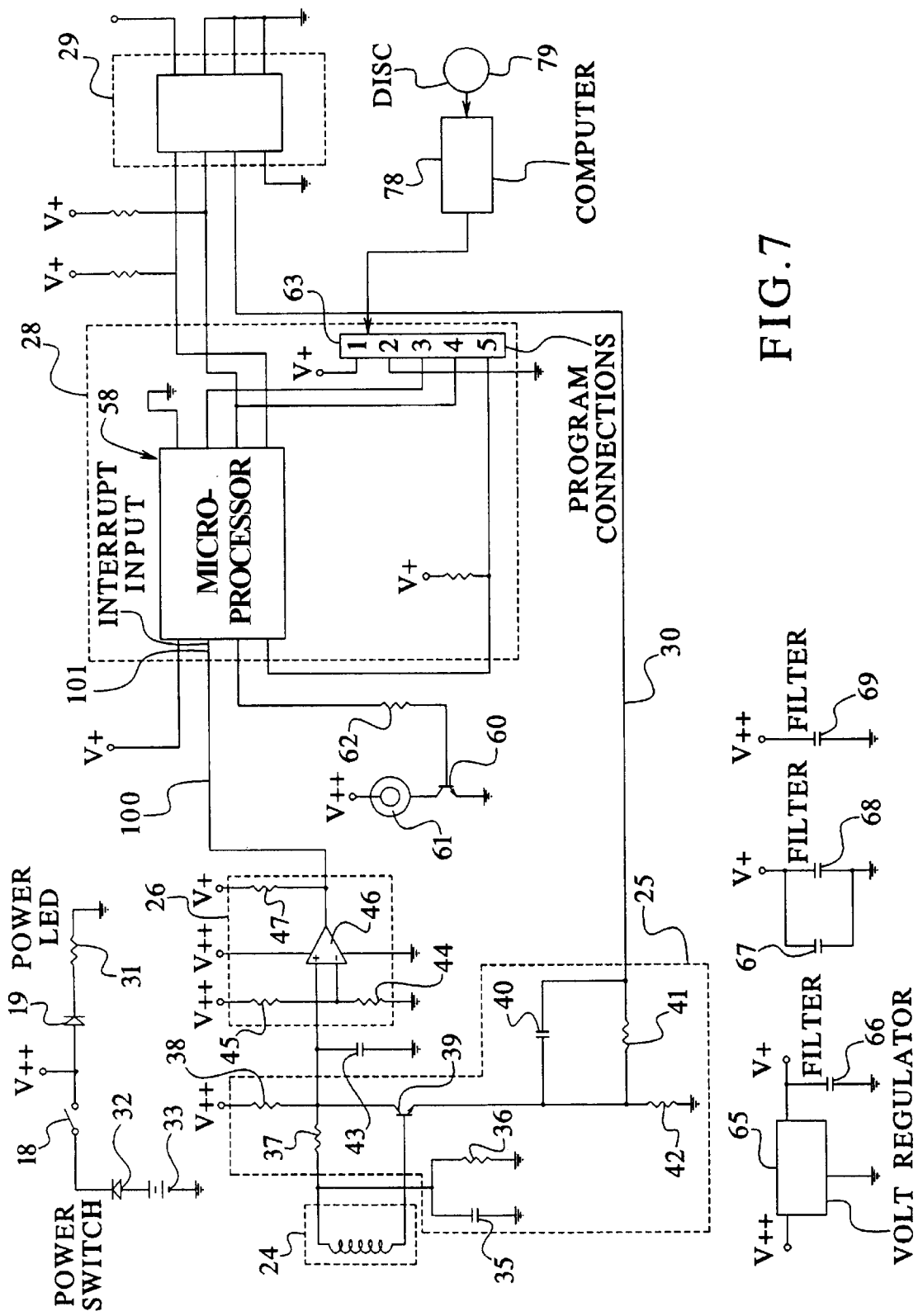
FIG. 7 is a schematic diagram of the inventor receiver portion of the improved circuit breaker detector system of the invention corresponding to the second embodiment block diagram of FIG. 6.

In the schematic diagram of FIG. 7 corresponding to the block diagram of FIG. 6, similar circuit elements which have been previously discussed in relation to FIG. 4 will not be discussed here. However, as can be seen in FIG. 7, the latch 27 of the first embodiments of FIGS. 2 and 4 is not present. Rather, the threshold comparator 26 output connects to a line 100 to an interrupt input 101 of the microprocessor chip 58.

Two alternate embodiments of software can be employed with the alternate embodiment employing the interrupt input on the microprocessor as shown in FIG. 7. In a first alternate embodiment as shown in FIG. 8, a start block 91 indicates power-up and the beginning of program execution. The initialize I/O and interrupts block 92 sets the microprocessor pins as inputs and outputs and enables the external hardware interrupt. The set-to-max-gain block 93 outputs the value to the D/A converter that sets the variable-gain stage to its maximum sensitivity. The calibrate-to-ambient (tare) block 9 decreases the gain of the variable-gain stage until no signal is present, thus preventing false signals from being validated. If an interrupt 98 occurs, then the program proceeds to the beep/decrement gain block 99 which will decrement the output value to the D/A converter, thereby decreasing the sensitivity of the variable gain stage. The gain value is then stored into memory 112, and then execution returns to the main program loop. If an out-of-range condition 95 occurs, the compensate block 96 increases the gain value output to the D/A converter to increase the sensitivity of the variable gain stage, thus presenting a loss-of-signal condition. The gain value is then stored, and block 97 and the program loops back to the out-of-range decision block 95.

Figure 9:
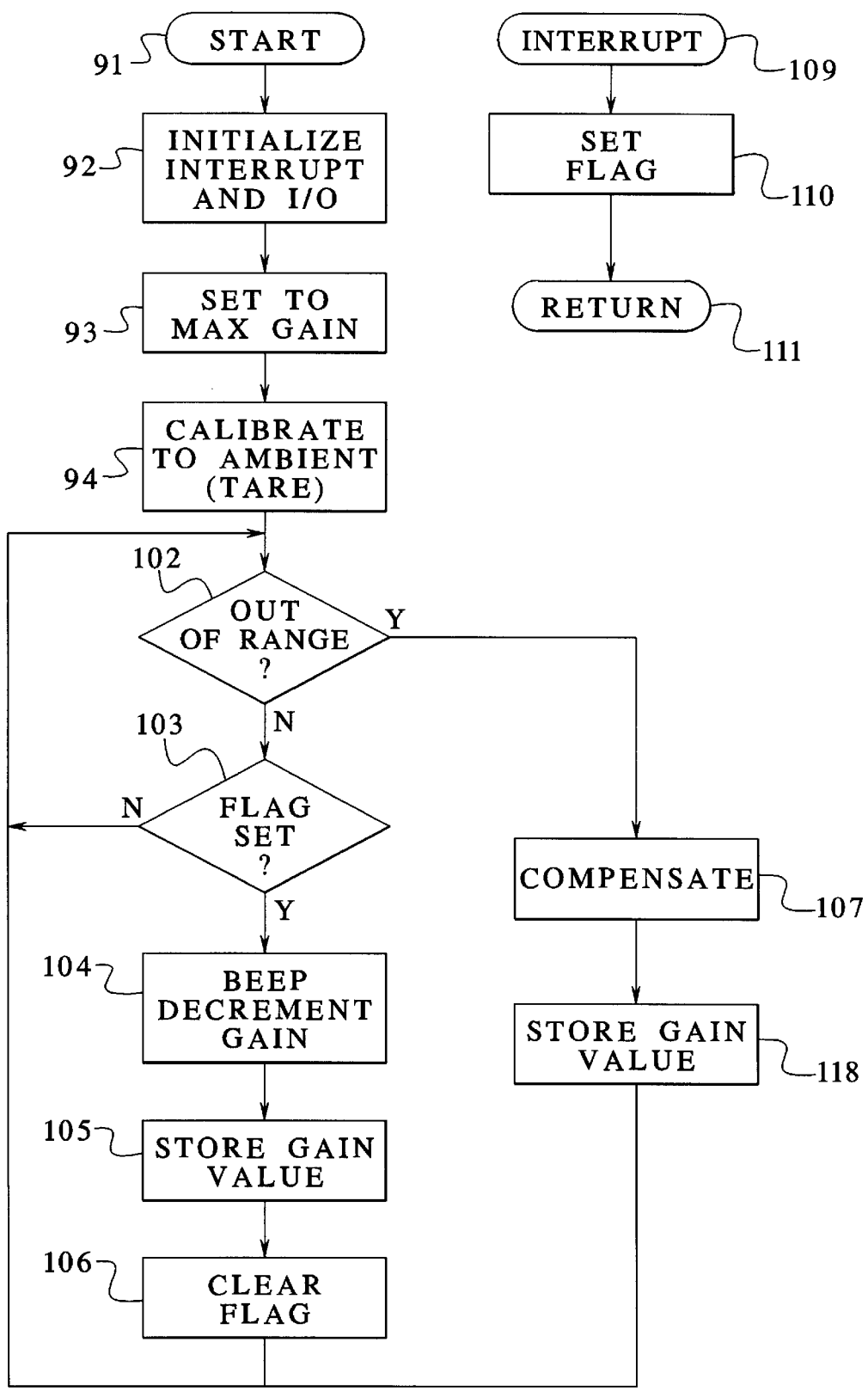
FIG. 9 is an alternate embodiment software block diagram for use with the second embodiment shown in FIGS. 6 and 7.

In the embodiment of FIG. 9, a start block 91 indicates power-up and the beginning of program execution. The initialize I/O and interrupt block 92 sets the microprocessor pins as inputs and outputs and enables the external hardware interrupt. The set-to-max-gain block 93 outputs the value to the D/A converter that sets the variable-gain stage to its maximum sensitivity. The calibrate-to-ambient (tare block 94 decreases the gain of the variable-gain stage until no signal is present, thus preventing false signals from being validated. If an out-of-range condition 102 occurs, the compensate block 107 increases the gain value output to the D/A converter to increase the sensitivity of the variable-gain stage, thus preventing a loss-of-signal condition. The gain value is then stored, block 118, and the program loops back to the out-of-range decision block 102. Decision block flag set 103 will loop back to the out-of-range decision block 102 if the input signal has not triggered the interrupt 109 which sets the flag 110, and then returns to execution of the main loop 111. If the flag is set, then the program proceeds to the beep/decrement-gain block 104 which will decrement the output value to the D/A converter, thereby decreasing the sensitivity of the variable-gain stage, and then annunciates to the user. The gain value is stored in memory 105, and the flag is cleared-block 106. The program then flows back to the out-of-range decision block 102.

Although various minor modifications might be suggested by those skilled in the art, it should be understood that we wish to embody within the scope of the patent warranted hereon all such modifications as reasonably and properly come with the scope of our contribution to the art.

We claim as our invention:

1. A method for detecting a particular AC circuit from among a plurality of AC circuits at a circuit box, comprising the steps of:

plugging a transmitter which creates a high amplitude high frequency current pulse into the particular AC circuit to be detected; and with a receiver, sensing the particular circuit at the circuit box by use of a sensing coil and employing a variable gain stage in conjunction with a threshold comparator and latch to pick off a signal caused by the high amplitude high frequency current pulse and latch the signal so that a microprocessor can vary gain of the variable gain stage and can read the signal to activate an indication to a user when the particular AC circuit has been located at the circuit box.

2. The method according to claim 1 including the step of utilizing the microprocessor to analyze and determine a strength of the signal and adjust a gain of the variable gain stage via a digital-to-analog converter so that the variable gain stage has its gain decreased.

3. The method according to claim 1 including the step of decreasing the gain of the variable gain stage until the signal can no longer be detected and then increasing the gain slightly so that the variable gain stage operates right at a threshold of the threshold comparator.

4. The method according to claim 1 including the step of programming the microprocessor after it is mounted into the receiver by use of a computer which transfers a program to the microprocessor.

5. The method according to claim 1 including the step of programming the microprocessor with a program which initializes inputs and outputs of the microprocessor, sets the digital-to-analog converter for maximum gain, automatically calibrates the variable gain stage to remove ambient noise, and stores a gain value for the digital-to-analog converter.

6. The method according to claim 5 including the step of waiting for the latch to set and determining whether the signal is within a time window, and if the signal is within the time window, then turning on the indication and decrementing gain for the digital-to-analog converter.

7. A method for automatically detecting a particular circuit among a plurality of circuits at a circuit box, comprising the steps of:

plugging a transmitter unit for creating a high amplitude high frequency current pulse into the particular circuit to be detected;

employing a receiver at the circuit box to position a pickup unit of the receiver adjacent the plurality of circuits, the receiver providing the user an indication when it is adjacent the circuit corresponding to the particular circuit in which the transmitter is plugged; and providing the receiver with a microprocessor having an associated latch at an input to the microprocessor which latches a received signal and automatically calibrating the receiver by use of the microprocessor.

8. The method according to claim 7 including the step of utilizing the program which is transferred into the microprocessor to initialize inputs and outputs of the microprocessor.

9. The method according to claim 7 including the step of utilizing the program to set a digital-to-analog converter for maximum gain and then performing an auto calibration function in a feedback loop having a threshold comparison, and performing a latching function for allowing the microprocessor to read a signal.

10. A method for detecting a particular AC circuit from among a plurality of AC circuits at a circuit box, comprising the steps of:

plugging a transmitter which creates a high amplitude high frequency current pulse into the particular AC circuit to be detected; and with a receiver, sensing the particular circuit at the circuit box by use of a sensing member and employing a variable gain stage which has its gain automatically decreased in steps so as to accurately detect a signal caused by the high amplitude high frequency current pulse at the particular AC circuit so that a microprocessor can read the signal to activate an indication to a user that the particular AC circuit has been located.

11. An automatic circuit breaker detector system, comprising:

a transmitter which outputs high current high frequency pulses onto an AC line; and a receiver having a sensing element connecting to a variable gain stage which in turn connects to a threshold comparator, the threshold comparator connecting to a microprocessor through a latch, an output of the microprocessor connecting to a digital-to-analog converter which feeds back to the variable gain stage.

12. The apparatus according to claim 11 wherein the microprocessor has a program for automatic calibration.

13. The system according to claim 12 wherein the program for automatic calibration performs an initializing of inputs and outputs, setting the digital-to-analog converter to maximum gain, calibrating to ambient, storing gain values, determining whether a signal is present within a time window, and then triggering an indication to the user.

14. An automatic circuit breaker detector receiver, comprising:

a sensing coil which senses high frequency high amplitude current pulses on an AC line;

a microprocessor connecting to a digital-to-analog converter; and an output of the digital-to-analog converter connecting back to a variable gain stage connecting the sensing element to the microprocessor.

15. An automatic circuit breaker detector system, comprising:

a transmitter which outputs high current high-frequency pulses onto an AC line; and a receiver having a sensing element connecting to a variable gain stage, the variable gain stage having an output connecting to a microprocessor, and an output of the microprocessor connecting in a feedback loop back to the variable gain stage.

16. A method for detecting a particular AC circuit from among a plurality of AC circuits at a circuit box, comprising the steps of:

plugging a transmitter which creates a high amplitude high frequency current pulse into the particular AC circuit to be detected; and with a receiver, sensing the particular circuit at the circuit box by use of a sensing coil and employing a variable gain stage whose gain is controlled by a microprocessor in conjunction with a threshold comparator connecting to an interrupt input of a microprocessor to pick off a signal caused by the high amplitude high frequency current pulse so that the microprocessor can read the signal to activate an indication to a user when the particular AC circuit has been located at the circuit box.

17. The method according to claim 16 including the steps of:

feeding an amplified signal from the variable gain stage to the threshold comparator;

if the amplified signal meets or exceeds a voltage reference of the threshold comparator, providing an interrupt signal at the microprocessor;

with the microprocessor, acting upon the interrupt signal by adjusting a value of a digital-to-analog converter which, through a feedback line, decreases a sensitivity of the variable gain stage; and using the microprocessor to alert the user.

18. The method according to claim 17 wherein if the amplified signal from the variable gain stage fed to the threshold comparator is determined by the microprocessor to be out of range, the microprocessor compensates by increasing the gain of the variable gain stage by a predetermined value which is output through the digital-to-analog converter and through the feedback line.

19. An automatic circuit breaker detector system, comprising:

a transmitter which outputs high current high frequency pulses into AC lines; and a receiver having a sensing element connecting to a variable gain stage which in turn connects to an interrupt input of a microprocessor, an output of the microprocessor connecting to a digital-to-analog converter which feeds back to the variable gain stage.

20. A method for automatically detecting a particular circuit among a plurality of circuits at a circuit box, comprising the steps of:

plugging a transmitter unit for creating a high amplitude high frequency current pulse into the particular circuit to be detected;

employing a receiver at the circuit box to position a pickup unit of the receiver adjacent the plurality of circuits, the receiver providing the user an indication when it is adjacent the circuit corresponding to the particular circuit in which the transmitter is plugged; and providing the receiver with a microprocessor which analyzes a received signal and automatically calibrates the receiver based on received signal strength by use of the microprocessor.

* * * * *